United States Patent [19]

Alzmann et al.

[11] Patent Number: 4,506,442
[45] Date of Patent: Mar. 26, 1985

[54] METHOD AND APPARATUS FOR STACKING A PLURALITY OF LAMINATE LAYERS TO FORM A COMPOSITE BOARD

[75] Inventors: Donald R. Alzmann; Michael Angelo, both of East Islip; Paul R. Waldner, Wantagh, all of N.Y.

[73] Assignee: Lenkeit Industries, Inc., Farmingdale, N.Y.

[21] Appl. No.: 428,042

[22] Filed: Sep. 29, 1982

[51] Int. Cl.³ .................... H05K 3/36; B65G 57/02
[52] U.S. Cl. ........................... 29/830; 414/27; 29/464; 156/364; 269/47; 269/54.1; 269/54.5; 271/145; 271/232
[58] Field of Search ............ 414/27, 35, 36; 156/362, 363, 364; 29/464; 228/49 C, 49 R, 190; 271/104, 121, 145, 232; 269/47, 52, 54.1, 59.1

[56] References Cited

U.S. PATENT DOCUMENTS

| | | | |
|---|---|---|---|
| 2,980,267 | 4/1961 | Kalish | 414/36 X |
| 3,214,827 | 11/1965 | Phohofsky | 228/190 X |
| 3,356,360 | 12/1967 | Ward | 269/52 |
| 3,545,632 | 12/1970 | Cooper | 414/27 |
| 3,823,460 | 7/1974 | Bergmann | 414/35 X |

OTHER PUBLICATIONS

Western Electric Tech. Digest, No. 58, Apr. 1980, pp. 1 & 2, by T. L. Aycock.

Primary Examiner—Howard N. Goldberg
Assistant Examiner—Carl J. Arbes
Attorney, Agent, or Firm—Posnack, Roberts, Cohen & Spiecens

[57] ABSTRACT

Apparatus for stacking a plurality of laminate layers in registered superposed relation to enable the layers to be joined to form a composite board comprising a table having a surface on which a plurality of laminate layers can be successively stacked in aligned superposed relation on pins slidably received in respective apertures in the table. The pins rest on support members which are carried on a lower support table mounted beneath the surface of the table on which the laminate layers are stacked. The lower support table is raised relative to the stack of laminate layers after successive laminate layers have been placed on the pins so that a given projection of the pins from the laminate layers will be obtained.

22 Claims, 11 Drawing Figures

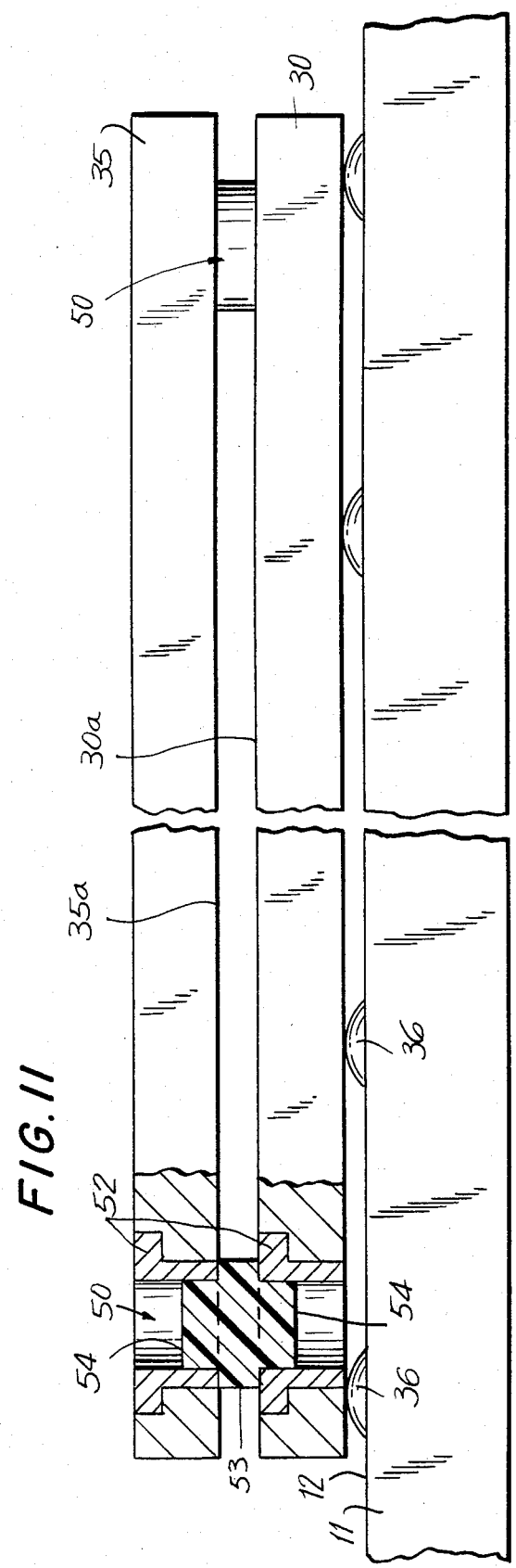

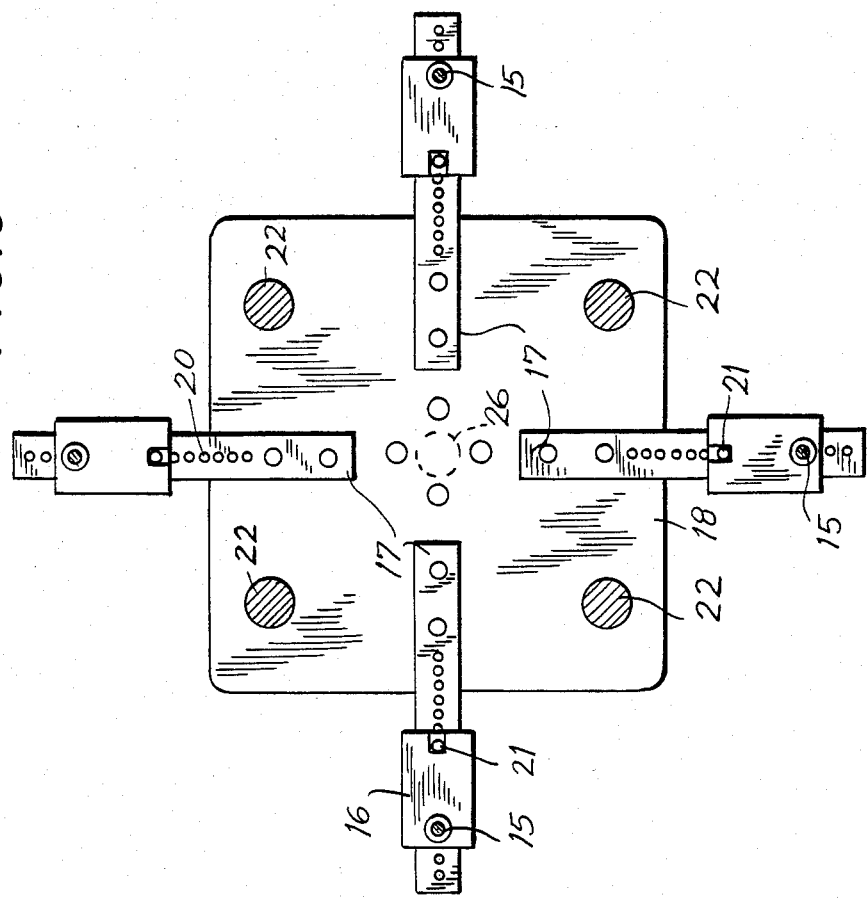
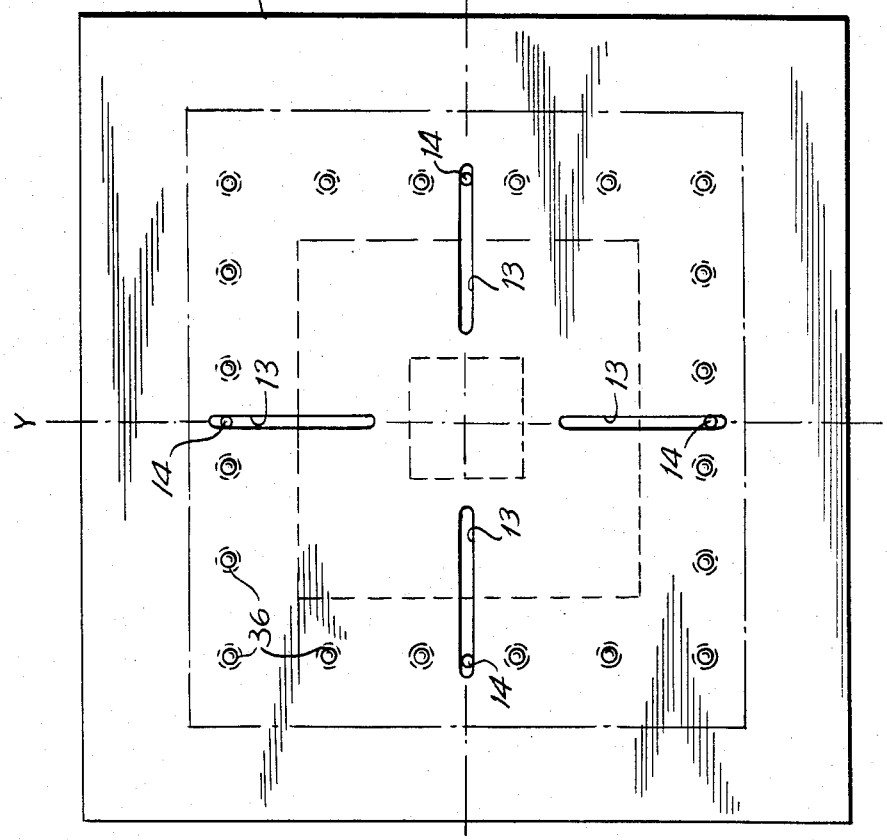

METHOD AND APPARATUS FOR STACKING A PLURALITY OF LAMINATE LAYERS TO FORM A COMPOSITE BOARD

FIELD OF THE INVENTION

The invention relates to apparatus and methods for stacking a plurality of laminate layers on aligning pins to form a stack of layers capable of being compressed under high temperature to form a laminate board for printed circuits and the like.

More particularly, the invention relates to apparatus and methods for forming a stack of groups of laminate layers in which each group forms a respective composite laminate board.

PRIOR ART

In the production of multi-layer composite circuit boards, a number of laminate layers are joined together to form a composite board which defines a particular circuit or part thereof. In the joinder of the laminate layers to form the composite board, it is essential that the layers be properly aligned and that the circuit information on each layer be correctly superposed with respect to the circuit information on the other layers so that connections can be made at common junctures to form the circuit.

Each laminate layer is produced by exposing a laminate sheet or board having a dry film coating which is light sensitive through a film (referred to as an artwork layer) on which circuit information is placed. The film selectively exposes the dry film coating on the laminate sheet to leave an image of the circuit information thereon. By selective erosion of the exposed laminate sheet and/or metal deposition, the laminate layer is produced on which circuit information is contained. By joining a plurality of laminate layers, in aligned superposition, under high pressure and temperature a multi-layer printed circuit board is obtained.

The multi-layer board is drilled with a number of holes at circuit junctures where circuit connections are made.

In order to align the laminate layers so that they are in proper registered superposed relation, it is conventional practice to mount the layers on aligning pins in a laminating fixture. In a conventional construction, the pins are secured in a rigid lower lamination plate and project a substantial distance therefrom in order to accommodate successive groups of laminate layers, each of which is to form a respective composite board.

When the entire stack of laminate layers has been placed on the pins, a top lamination plate is placed on the uppermost laminate layer and the entire assembly is transported to a press where high pressure and temperature is applied to the layers to form the composite boards.

In each of the groups of laminate layers to form a respective board, intermediate layers referred to as "pre-preg" layers are interposed. These pre-preg layers are adhesive layers which at high temperatures serve to bond the adjoining laminate layers together. The pre-preg layers are conventionally made of suitable plastic material such as Tedlar. Furthermore, between each of the groups of laminate layers for each composite board, there is placed a separator plate of plastic-coated or chrome-coated stainless steel. A stack as of much as 9 groups of laminate layers can be placed in superposition on the pins. Moreover, each group of laminate layers and intermediate pre-pregs includes between 6 and 10 layers per composite board. Thus, the pins project a substantial distance from the lower lamination plate of the order of several inches.

It is extremely difficult and time consuming to place thin material over the pins of the lamination fixture especially the lower laminate layers which are the first to be placed on the pins.

This invites an operator to place the material on the pins at one end and to push the material down on the pins and then stretch the other end of the material over the remaining pins. This causes stretching or tearing of the holes in the material and drastically reduces accuracy in registration.

SUMMARY OF THE INVENTION

An object of the invention is to provide apparatus for stacking a plurality of laminate layers in registered superposed relation to enable the layers to be joined to form a composite board which avoids the problem noted above with regard to the conventional procedure.

A further object of the invention is to provide such apparatus which also increases accuracy of registration while reducing the time for stacking the laminate layers.

A further object of the invention is to provide such apparatus which simplifies the operation of the operator and substantially eliminates deformation of the laminate layers.

In accordance with the above and further objects of the invention, there is provided an apparatus for stacking a plurality of laminate layers in registered superposed relation to enable the layers to be joined to form a composite board, which comprises a table having pins slidably mounted in apertures therein for extension from the table, the laminate layers being successively stacked in aligned relation on the pins. A support means supports the pins in the apertures and in further accordance with the invention, a suitable means serves for raising the support means relative to the table after successive laminate layers have been placed on the pins to provide a given projection of the pins from the laminate layers placed on the pins.

In this way, the pins can remain at a relatively small projection from the uppermost of the stacked laminate layers which substantially eliminates any need to deform the laminate layers to place the same on the pins.

In further accordance with the invention, the pins are raised by the raising means in steps after successive laminate layers have been placed on the pins in order to maintain the given relatively minimal projection of the pins from the uppermost layer of the stack.

In further accordance with the invention, a slidable support, preferably in the form of a layer of compressed air, is formed on the table for removal of the stacked layers therefrom.

In further accordance with the invention, the table is provided with apertures or slots and the pin support means can be adjusted in position to allow the pins to accommodate layers of different sizes.

The invention contemplates a power means for raising the pin support means and the pins therewith.

In accordance with a feature of the invention, after the uppermost layer of the stack has been placed on the pins, a top lamination plate is applied to the stack by means of a pivotably mounted assembly on the table. In one embodiment, the top plate is held on the pivotably mounted assembly by magnetic or electromagnetic force and is separated from the assembly after the top plate has been placed in registered position on the stack.

The invention also contemplates a method of stacking laminate layers in which the laminate layers are successively stacked in aligned superposed relation on aligning pins which are successively raised after successive laminate layers have been placed on the pins to provide a pre-determined projection of the pins from the last successive layers placed on the stack.

The invention will be described hereinafter in relation to a specific embodiment thereof. This embodiment is given by way of example of a best mode of construction of the invention and is undertaken with reference to the attached drawing.

BRIEF DESCRIPTION OF THE SEVERAL VIEWS OF THE DRAWING

FIG. 3 is a detail of a portion of the construction shown in FIG. 2.

FIG. 4 is a plan view of the apparatus shown in FIG. 2.

FIG. 5 is a sectional view taken on line 5—5 in FIG. 2.

FIG. 11 is an elevational view, partly broken away in section, showing top and bottom lamination plates as delivered to the lamination apparatus.

DETAILED DESCRIPTION

Figure 1:
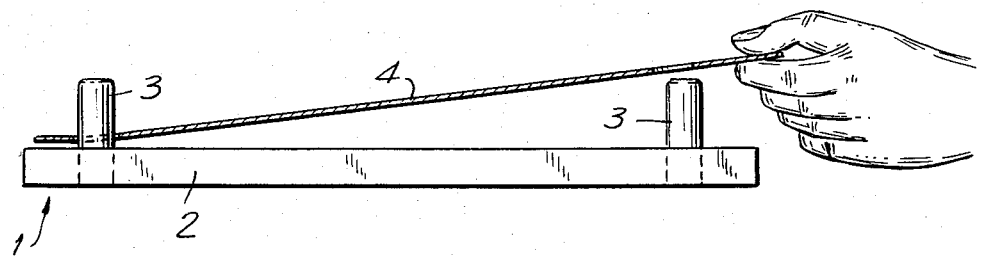
FIG. 1 is a diagrammatic illustration of a lamination fixture according to the prior art showing its mode of use.

Referring to FIG. 1, which illustrates a lamination apparatus of the prior art, therein is seen a lamination fixture 1 which comprises a bottom lamination plate 2 carrying a plurality of lamination pins 3 thereon. The lamination pins project upwardly from the lamination plate 2 in order to permit a succession of laminate layers 4 to be placed on the pins 3 in superposed relation. The lamination pins 3 are of close tolerance to serve as a means for precisely registering the laminate layers in their superposed relation. This is necessary since the laminate layers each contain circuit information which must be correctly superimposed with respect to the circuit information on the other layers so that when the laminate layers are joined under pressure, the desired electrical circuits will be formed and electrical connections can be made at common junctures of the electrical circuit.

In order to from a composite board, a plurality of laminate layers are superimposed with intermediate location between the laminate layers of an adhesive or so-called pre-preg layer. The laminate layers are relatively thin, of the order of 0.012 to 0.030 inches. A group of between 6 and 10 laminate layers forms a composite board. A plurality of groups of laminate layers with intermediate pre-preg layers are placed on the lamination pins. A stainless steel separator plate is placed between each group of laminate layers which is to make up a composite board. The stainless steel plates are of the order of thickness of between 0.020 and 0.060 inches. The complete assembly is of the order of between one and several inches which requires a length of pin 3 of this order. Additionally, after the laminate layers with separator plates have been placed on the pins, a top lamination plate is placed on the pins to form a complete assembly which can be transported to a press where high pressure and temperature is applied to the top and bottom lamination plates to effect formation of the multiple number of composite boards.

The top and bottom lamination plates are made of hot-rolled steel and they are stress relieved and ground flat to very close tolerances. They are of the order of thickness of 0.275 inches. To preserve these relatively expensive top and bottom plates, stainless steel separator plates should be placed between the top and bottom plates and the adjoining laminate layers. The lamination pins 3 are fitted with extremely close tolerances in corresponding holes or slots in the laminate layers and in bushings in the top and bottom plates in order to ensure that the laminate layers will be precisely aligned in superposed relation.

However, it requires skill to place the thin laminate layers on the pins 3, particularly the first of the laminate layers as the pins have their maximum projection at this time.

There is a tendency for operators to place the first laminate layers on the pins at one end (the left end in FIG. 1 of the drawing) and push the material down on the pin. The material is then stretched at the other end over the remaining pins. This causes stretching or tearing of the holes in the laminate layers which drastically reduces accuracy in registration.

Ordinarily, at least four pins are employed to serve as a guide for the positioning of the laminate layers, and after the first lamination pin 3 is inserted into the corresponding hole of a laminate layer, it becomes a difficult matter to insert the remaining pins into the other holes of the laminate layer.

Figure 2:
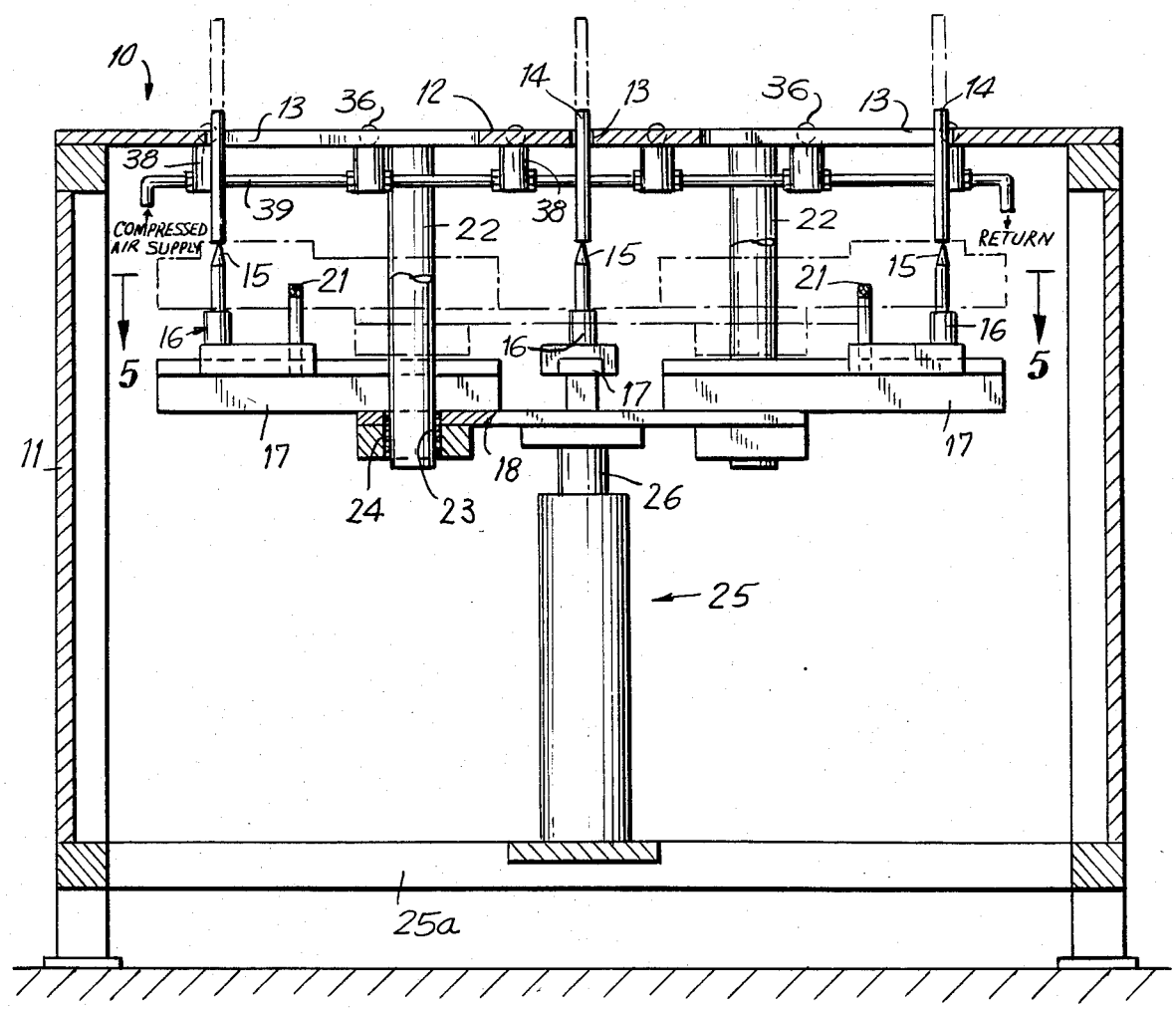
FIG. 2 is a side elevational view, partly in section, of one embodiment of lamination apparatus according to the present invention.

Referring to FIGS. 2 and 4 of the drawing, therein is shown apparatus 10 for stacking a plurality of laminate layers in registered superposed relation to enable the layers to be joined to form a composite board. As will be seen, the apparatus 10 avoids the problems produced by the conventional lamination fixture 1 of placing the layers on the pins as shown in FIG. 1.

The apparatus 10 comprises a table 11, which has an upper surface 12 on which an assembly for forming a circuit board including a plurality of laminate layers can be successively stacked in aligned superposed relation. The table 11 is provided with a plurality of slots 13 serving as aperture means in which lamination pins 14 are slidably mounted. Four pins 14 are employed at equidistant locations from the center of the table and four slots 13 extend along X and Y axes. The pins 14 are loosely fitted in slots 13 and can be adjusted in position along the slots to accommodate laminate layers of different size. The laminate layers are provided with respective alignment holes therein for receiving the pins 14. While four pins have been shown for aligning the laminate layers, it will be evident that more or less pins can be employed as desired. The holes which are formed in the laminate layers can be slotted to take advantage of centering of the layers by means of accurate placement of cylindrical pins in slotted holes as is conventionally employed and referred to in our earlier application Ser. No. 325,566.

Each of the pins 14 is supported at its lower end by a support member 15 which is secured to a block 16 slidably mounted on a rail 17. The rail 17 is affixed to a lower plate 18. Each of the rails 17 occupies a position beneath the surface 12 of table 11 such that the rails are beneath respective slots 13. Each of the rails 17 is provided with a respective row of holes 20 which is aligned with a corresponding slot 13 in the table. The block 16 carries a pin 21 which is vertically movable to a raised position in which the block 16 can be displaced along the rail 17. When the block 16 has reached a position in which the pin support 15 corresponds to the holes in the laminate layers of a particular size, the pin 21 is lowered to lock the block 16 by engaging into a respective hole 20. In this way, the pin support members 15 can be adapted to the placement of the pins 14 for the various sizes of laminate layers which are to be superimposed on the table.

Mounted in depending fashion from the top of table 11 are four shafts 22 which are engaged in holes 23 in lower plate 18 through the intermediary of bearings 24. Thereby, the lower plate 18 can be freely displaced vertically on the shafts 22.

Centrally mounted at the bottom of lower plate 18 is a fluid actuated power cylinder 25. The cylinder is fixed by frame 25a to the table 11.

The power cylinder 25 includes a piston 26 which is connected to the lower plate 18. Upon actuation of the cylinder 25 to extend the piston 26, the lower plate 18 will be displaced upwardly while riding on the shafts 22. In the course of upward travel of the lower plate 18, the pin supports 15 will raise the pins 14 in the slots 13 of the table. The table 18 is movable between a lowered position in which the pins can be lowered beneath the surface 12 of the table to a raised position as shown in chain-dotted outline in FIG. 2. In the raised position, the pins will project a maximum distance from the surface 12 of the table.

Figure 10:
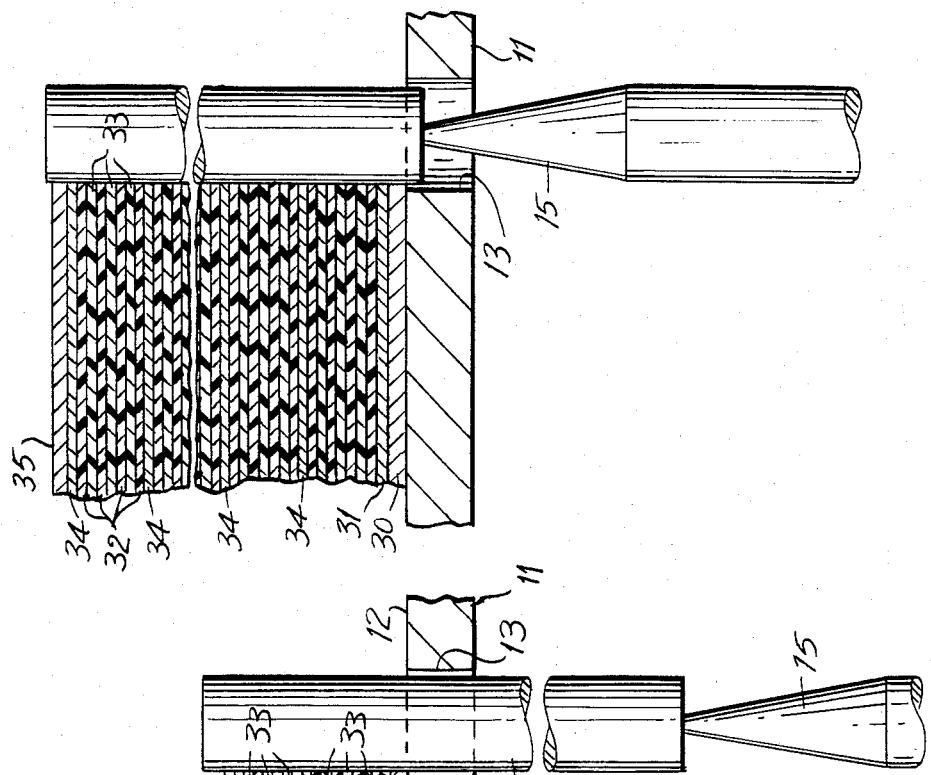
FIGS. 8, 9 and 10 are diagrammatic, explanatory views showing the operation of placement of lamination layers on the lamination apparatus of the invention.
Figure 9:
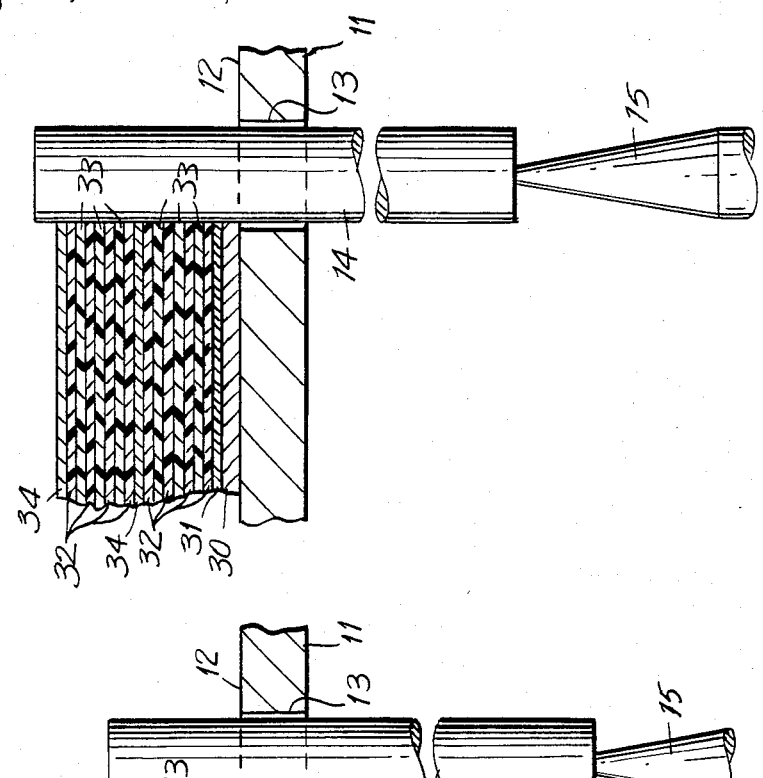

The operation of stacking laminate layers on the pins will next be explained with reference to FIGS. 8–10.

Figure 8:
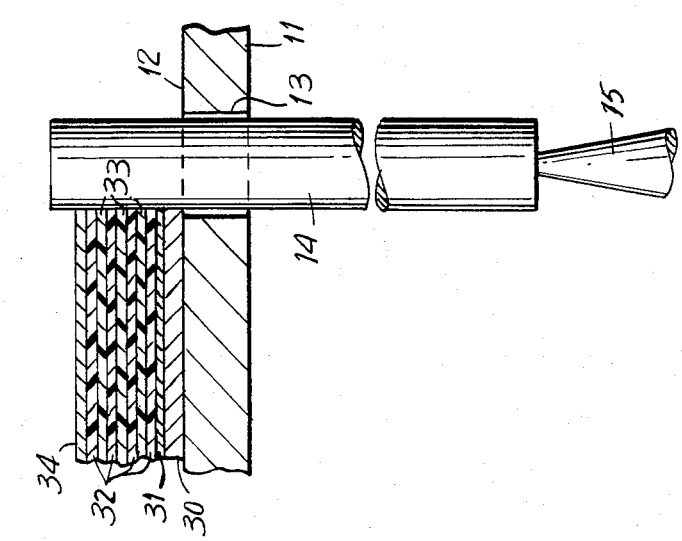

In FIG. 8, there is seen the pin 14 in a minimum projected position above the surface 12 of the table 11 and a succession of layers has been placed on the pin 14 in the following order: first, the lower lamination plate 30 is placed on the table in a position in which holes in the plate 30 are aligned with the pin support members 15 beneath slots 13; pins 14 are then inserted into the holes on the plate 30 and through the slots 13 until they rest on support members 15; thereafter, a stainless steel separator plate 31 is placed on the pins to rest on the lower plate 30; then a number of laminate layers 32 with intermediate pre-preg layers 33 are placed on the pins. When the number of laminate layers which is to make up a laminate board has been placed on the pins, a stainless steel separator plate 34 is placed on the assembly. The cylinder 25 is then actuated to raise the pins 14 by an amount suitable to receive the next group of laminate layers to form the next board.

The pins 14 are of tight fit in the holes in the laminate layers 32 and the lower plate 30, and there may be a tendency for the pins to disrupt the layers in the course of their upward travel. Accordingly, the operator can apply pressure to the separator plate 34 in order to hold the entire assembly in place while the pins are passed through the layers. The displacement of the pins can be controlled automatically or manually. A foot pedal (not shown) is utilized to actuate the cylinder 25 and in the case of automatic operation, when the foot pedal is depressed, a switch is closed which produces energization of a hydraulic circuit for an adjustable predetermined period of time so that the cylinder 25 is actuated to produce a specific given displacement of the piston 26 and thereby of the pins 14. In the manual mode of operation, the cylinder 25 is activated as long as the foot pedal is depressed by the operator, in which circumstance the operator can control the degree of projection of the pins 14.

After the condition in FIG. 8 has been achieved, and the pins 14 have been raised to their next level, the next group of laminate layers is placed on the pins followed by the separator plate for the subsequent group. The process is repeated until a plurality of groups of laminate layers are placed on the pins and the pins have reached their maximum position of projection from the table as shown in FIG. 10. Then the top lamination plate 35 is placed on the stack to complete the assembly. The assembly of lamination plates 30 and 35, with the sandwiched laminate layers, pre-pregs and separator plates is removed from the table with the pins 14 in place in the assembly, to a press where pressure is applied to the lamination plates 30 and 35 while the assembly is heated in order to produce a plurality of laminate boards equal to the number of groups of successive laminate plates which have been placed in the pins. Thereafter, the pins are knocked out of the holes for subsequent reuse.

In order to facilitate placement of the lower lamination plate 30 on the table 11, a slidable support is provided on the table in the form of balls 36 and a layer of compressed air. As seen in FIGS. 3 and 4, a plurality of balls 36 are arranged over the extent of the table, and each of the balls is spring mounted in a corresponding opening in the table for free rotational movement and for movement between a normal projected position above the surface 12 of the table as shown and a lowered, retracted position below the level of surface 12. Each ball 36 is supported in a ball assembly 37 engaged in a respective hole in table 11. The ball assembly comprises a body 37a of plastic material with a bore 37b in which the ball 36 can freely travel. A retainer lip 37c is formed at the upper end of bore 37b to prevent the ball 36 from being removed from the body from above while permitting its free rotation and its resilient movement between the retracted and projected position. A spring 37d acts on a slidable piston 37e which includes a stem 37f which bears against ball 36 to press the ball upwardly. The piston 37e contacts an annular seal 37g affixed in the bore 37b in the raised position of the ball to seal the bore 37b from below. The lower portion of body 37a is formed with external threads 37h for threadably receiving a duct 38 connected to a compressed air line 39.

In the normal raised position of ball 36, the duct 38 is closed and no airflow will take place through assembly 37. However, when lamination plate 30 rests on the balls 36, the weight of the plate will cause the spring-loaded balls to be lowered and compressed air flows through the ducts 38 and the assemblies 37 to form a layer of compressed air supporting the lamination plate 30 in combination with the balls 36. In this way, the bottom lamination plate 30 can be moved effortlessly over the surface 12 of the table. When the lamination plate 30 has reached the position in which its holes are aligned with the position of the pins 14, the compressed air supply to line 39 is terminated whereby the plate 30 now rests on the surface 12 of the table 11. The pins 14 are now inserted through the holes in the lamination plate 30 until the pins rest on the pin supports 15 therebeneath. The apparatus is now in position to receive the group of laminate layers to form the first composite board.

Figure 6:
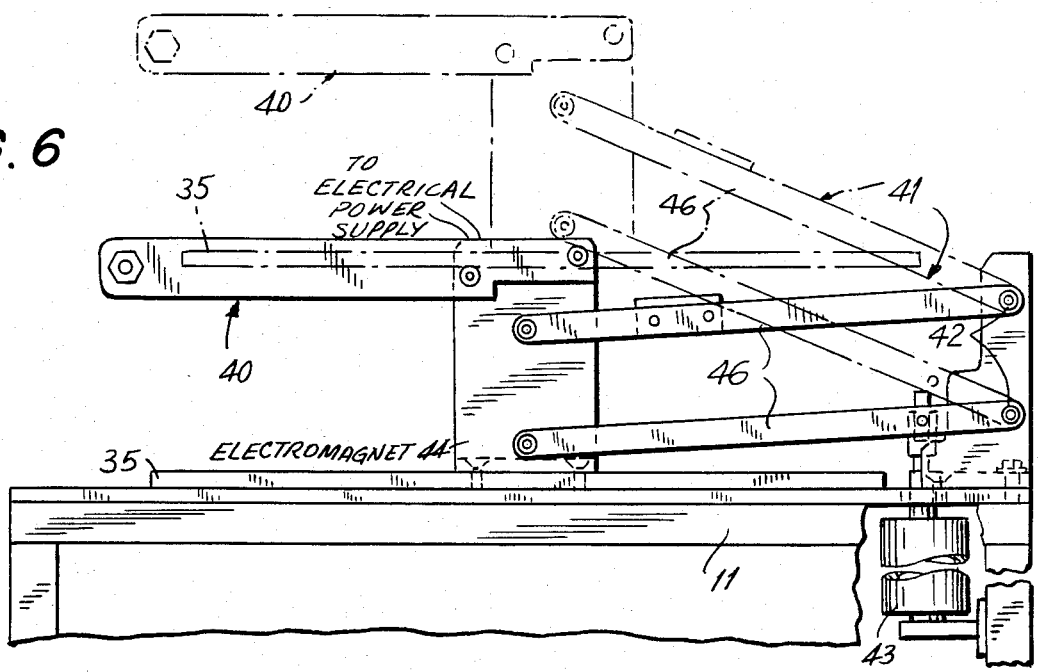
FIG. 6 is a side elevational view, partly broken away in section of the apparatus showing a portion thereof which is omitted in FIG. 2.
Figure 7:
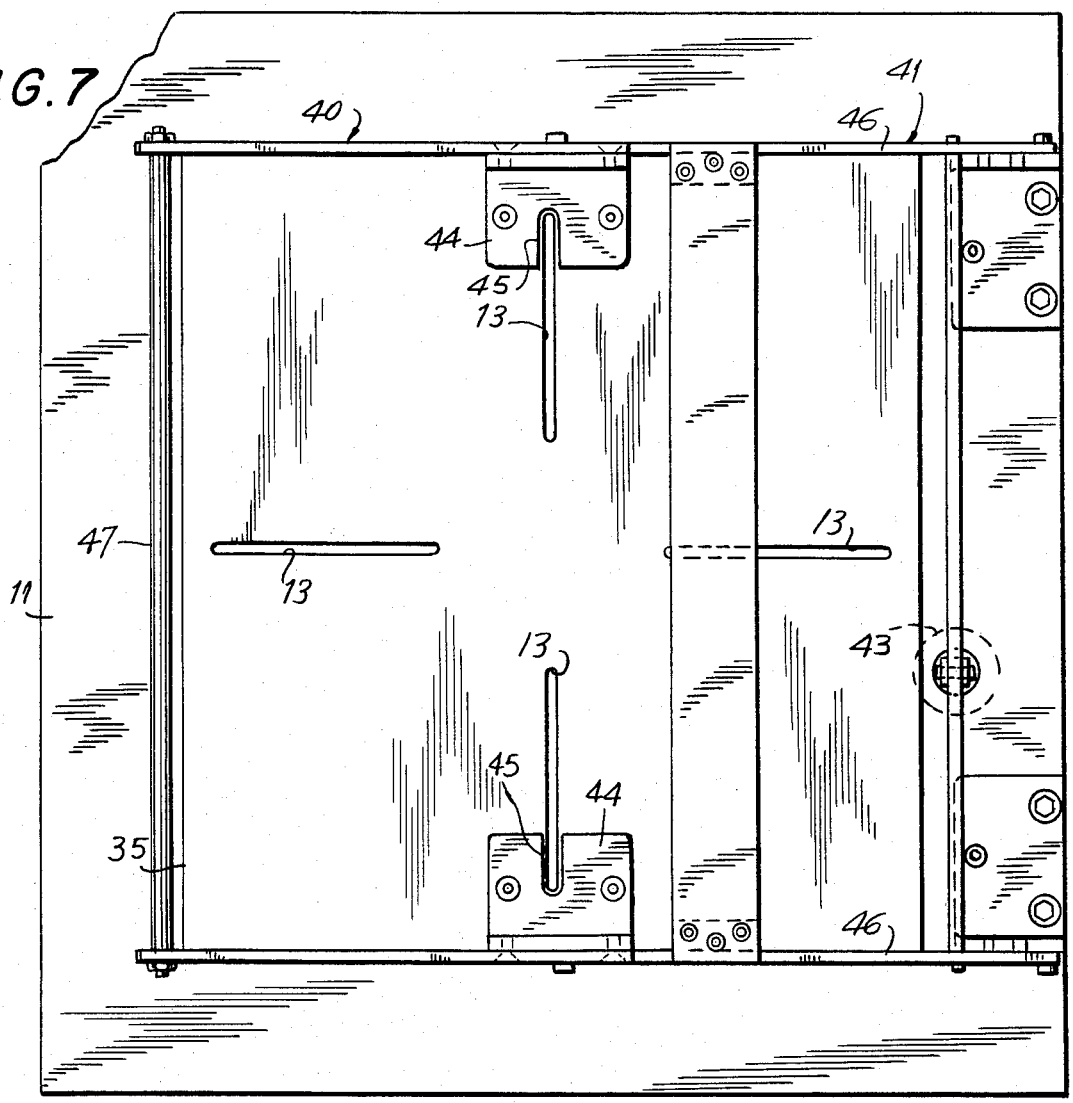
FIG. 7 is a plan view of the apparatus shown in FIG. 6.

In order to facilitate placement of the top lamination plate 35 on the completed stack of laminate layers, an assembly 40 is utilized as shown in FIGS. 6 and 7. The assembly 40 comprises a frame 41 which is pivotably connected to the table 11 by hinges 42. The frame 41 is displaceable between a lowered operative position as shown in solid lines in FIG. 6 and a raised inoperative position as shown in china-dotted lines in FIG. 6. In order to raise and lower the frame 41, a power cylinder 43 is mounted on the table and engages the frame 41. The frame 41 carries a pair of opposed plates 44 which are provided with respective slots 45 positioned such that they are aligned with respective slots 13 as shown in FIG. 7. The plates 44 can be made of magnetic material or can be constructed as electromagnets connected to an electrical power supply in order to selectively hold and support the top lamination plate. The top lamination plate is magnetically held on the underside of frame 41 in the raised position with the holes in the top lamination plate aligned with the slots 45. After, the completed stack of plates and layers has been assembled on pins 14 on the table 11, the frame 41 is then brought to a lowered position at which the holes in the top lamination plate will receive the projecting pins 14.

As seen, the frame 41 includes arms 46 which are parallel to one another and are connected to the plates 44 such that movement of the frame between its lowered and raised positions is effected with the frame in a constant horizontal attitude and wherein at the end of its travel, the movement of the frame is substantially vertical. If necessary, the hinges 42 can be mounted for vertical movement to insure absolute vertical movement of the frame at the end of its travel. This assures that at the end of its lowered movement, the holes in the top lamination plate will be able to receive the projecting pins. The arms 46 effectively form a parallelogram linkage to achieve the desired displacement operation of the frame 41 and the top lamination plate supported therewith. The frame is formed with a grip arm 47 at the front end to assist in the displacement of the frame. If desired, the frame 41 can be manually operated, in which case the cylinder 43 can be omitted.

From the above, it is seen that the invention provides a system for stacking a plurality of laminate layers in registered superposed relation to enable the layers to be joined to form a composite board. The invention provides for successive staking of a plurality of laminate layers in aligned superposed relation on the pins projecting through the upper surface of the table and raising the pins relative to the table after successive laminate layers have been placed on the pins to provide a pre-determined projection of the pins from the last successive laminate layers placed on the stack.

In general, the projection of the pins above the last layer of the stack will be of the order of one-eighth of an inch. Effectively, therefore, the pins are successively and stepwise displaced by one-eighth of an inch each time that a completed group of laminate layers has been placed on the pins.

As previously explained, the top and bottom lamination plates 30 and 35 are relatively large and heavy and their operative surfaces (30a and 35a respectively in FIG. 11) are ground flat to very close tolerances. The plates 30 and 35 are relatively expensive and it is essential to preserve their ground surfaces and prevent damage thereto such as by scratching or the like. In order to facilitate travel of the plates onto the surface 12 of table 11, the balls 36 and the means for producing the air layer as a cushion support for the plate 30 have been described. Referring further to FIG. 11, therein it is seen that the lamination plates 30 and 35 are delivered to the table 12 as an assembly with interposed spacer elements or plugs 50 holding the plates in assembled relation with their operative surfaces 30a and 35a in spaced relation from one another. In particular, the plates 30 and 35 are provided with bushings 52 in which the plugs 50 are fitted. After the plates 30 and 35 have been accurately positioned on the table, the compressed air supply is halted and the plate 30 is permitted to rest on the surface 12 of the table 11. The top plate 35 is then secured to assembly 40 by electromagnetic plates 44 and lifted off the bottom plate 30. The plugs 50 are then removed from the bushings 52 in the lower plate 30 and the pins 14 are inserted into the bushings 52 and through the slots 13 in the table 11 until they rest on the pin support members 15. The bottom lamination plate 30 is now ready to receive the first separator plate and the subsequent laminate and pre-preg layers in the manner previously described.

The plugs 50 are each formed with a cylindrical central body 53 from which two cylindrical projections 54 extend coaxially. The projections 54 project into the bushings 52 and serve to align the top and bottom plates while preventing relative sliding movement therebetween. The central body 53 keeps the surfaces 30a and 35a of the plates from coming into contact with one another and producing potential damage.

The plugs 50 are made of a material, preferably a plastic material such as Deldrin, which is softer than the bushings 52 so as not to distort the holes in the bushings which are to receive the alignment pins 14 with close fit. The plugs are removable from the bushings for repeated use after the bottom plate 30 is in position and the air supply has been turned off.

While the invention has been described in conjunction with a specific embodiment thereof, it will become apparent to those skilled in the art that numerous modifications and variations can be made within the scope and spirit of the invention as defined by the attached claims.

What is claimed is:

1. A method of stacking a plurality of laminate layers in registered, superposed relation to enable the layers to be joined to form a composite board, said method comprising successively stacking a plurality of laminate layers in aligned superposed relation on pins projecting through a support surface of a table, the laminate layers being provided with alignment holes through which the pins extend when the layers are stacked thereon, raising said pins relative to said table after successive laminate layers have been placed on the pins to provide a predetermined projection of the pins from the last successive laminate layers placed on the stack and removing the stack of laminate layers with said pins therein from the table.

2. A method as claimed in claim 1 comprising slidably displacing the stacked laminate layers for discharge from the table.

3. A method as claimed in claim 2 wherein the slidable displacement of the stack is effected on a layer of compressed fluid.

4. A method as claimed in claim 1 wherein the raising of the pins is effected stepwise after a number of laminate layers are placed on the stack.

5. A method as claimed in claim 4 wherein the raising of the pins is effected by the application of power to the pins.

6. A method as claimed in claim 1 comprising applying a rigid top plate to the stack of laminate layers for removal therewith.

7. A method as claimed in claim 5 comprising stacking the laminate layers on a rigid bottom plate through which the pins project, said bottom plate being removed with said stack from the table.

8. A method as claimed in claim 1 comprising inserting the pins into apertures in the table before stacking the laminate layers on the pins.

9. A method as claimed in claim 8 comprising supporting the pins below the table on a raisable support.

10. Apparatus for stacking a plurality of laminate layers in registered, superposed relation to enable the layers to be joined to form a composite board, said apparatus comprising a table having a surface on which a plurality of laminate layers can be successively stacked in aligned superposed relation, the laminate layers being respectively provided with alignment holes therein adapted for being aligned in successively stacked layers, said table having aperture means for alignment with the holes in the laminate layers, a pin slidably mounted in each aperture means in said table for extension therefrom, said pin being freely insertable in and removable from its respective aperture means, support means for support of the pins in the aperture means in the table to permit the laminate layers to be mounted on the pins in succession, said pins being insertable into said aperture means for freely resting on said support means so that the pins can be freely lifted off the support means, and means operatively associated with the support means for raising the support means relative to said table after successive laminate layers have been placed on the pins to provide a given projection of the pins from laminate layers placed on the pins.

11. Apparatus as claimed in claim 10 wherein said pins are raised by said raising means in steps after successive laminate layers have been placed on the pins.

12. Apparatus as claimed in claim 10 comprising means supported by the table for providing a slidable support on said table for removal of the stacked laminate layers therefrom.

13. Apparatus as claimed in claim 12 wherein said means for providing the slidable support includes means operatively associated with the slideable support for providing a layer of compressed air on the table beneath said stack.

14. Apparatus as claimed in claim 10 wherein said support means comprises a support assembly mounted beneath said surface of said table for vertical displacement with respect to said surface, and pin support members secured to said support assembly and on which the respective pins freely rest so as to be removable from the pin support members whereby the pins can be removed from the table along with the aligned laminate layers.

15. Apparatus as claimed in claim 14 comprising power means operatively associated with the support assembly for displacing said support assembly and the pin support members with the pins resting thereon as a unit.

16. Apparatus as claimed in claim 14 wherein the aperture means in the table allows the pins to be selectively located for different sizes of laminate layers, said support assembly including means operatively associated with the support members for adjusting the position of the pin support members in correspondence with the selected location of the pins.

17. Apparatus as claimed in claim 14 comprising means mounted on said table for applying a top plate on the stack of laminate layers.

18. Apparatus as claimed in claim 17 wherein said means for applying the top plate comprises a pivotably mounted assembly operatively associated with said table on said table.

19. Apparatus as claimed in claim 18 wherein said top plate is held by said pivotably mounted assembly, the latter having a raised, inoperative position in which the top plate is away from the surface of the table and a lowered, operative position in which the top plate is applied on the stack of laminate layers.

20. Apparatus as claimed in claim 19 wherein a bottom plate is mounted on said pins and is placed on the surface of the table, the laminate layers being stacked on said bottom plate, said bottom plate being provided with holes through which the pins extend.

21. Apparatus as claimed in claim 20 comprising means operatively associated with said top and bottom plates for holding the top and bottom plates to prevent relative sliding movement thereof before assembly with the stack of laminate layers.

22. Apparatus as claimed in claim 10 comprising means attached to the pivotably mounted assembly for holding the top plate magnetically from said pivotably mounted assembly.

* * * * *